(12) United States Patent
Takagi

(10) Patent No.: US 8,357,942 B2
(45) Date of Patent: Jan. 22, 2013

(54) SEMICONDUCTOR DEVICE WITH A PERIPHERAL CIRCUIT FORMED THEREIN

(75) Inventor: Kazutaka Takagi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 245 days.

(21) Appl. No.: 12/296,624

(22) PCT Filed: Oct. 1, 2007

(86) PCT No.: PCT/JP2007/069221
§ 371 (c)(1),
(2), (4) Date: Oct. 9, 2008

(87) PCT Pub. No.: WO2008/041682
PCT Pub. Date: Apr. 10, 2008

(65) Prior Publication Data
US 2009/0267080 A1    Oct. 29, 2009

(30) Foreign Application Priority Data
Oct. 2, 2006  (JP) .................. 2006-270511

(51) Int. Cl.
*H01L 29/12* (2006.01)
(52) U.S. Cl. .......... 257/76; 257/706; 257/724; 257/726; 257/E29.068; 438/106
(58) Field of Classification Search ............ 257/76, 257/E29.068
See application file for complete search history.

(56) References Cited

U.S. PATENT DOCUMENTS

| 5,901,042 | A | 5/1999 | Ota et al. |
| 6,365,918 | B1 | 4/2002 | Litwin et al. |
| 2002/0072147 | A1* | 6/2002 | Sayanagi et al. ............ 438/106 |
| 2003/0183863 | A1 | 10/2003 | Nakao et al. |
| 2006/0057793 | A1* | 3/2006 | Hatori et al. ............... 438/197 |
| 2006/0138655 | A1 | 6/2006 | Takagi |
| 2006/0152300 | A1 | 7/2006 | Inoue et al. |

FOREIGN PATENT DOCUMENTS

| DE | 196 41 875 A1 | 6/1997 |
| EP | 1 351 300 A2 | 10/2003 |

(Continued)

OTHER PUBLICATIONS

U.S. Appl. No. 12/786,942, filed May 25, 2010, Takagi.

(Continued)

*Primary Examiner* — Lynne Gurley
*Assistant Examiner* — Vernon P Webb
(74) *Attorney, Agent, or Firm* — Oblon, Spivak, McClelland, Maier & Neustadt, L.L.P.

(57) ABSTRACT

In a semiconductor device by which peripheral circuit sections, such as a semiconductor element, a matching circuit section, a bias circuit section, a capacitor element, are placed on and connected to a substrate, the semiconductor element can be grounded, and the semiconductor device which can make heat radiation characteristics of the semiconductor element satisfactory is provided, without providing a via hole into a semiconductor substrate.

It includes: a semiconductor element (2) placed on a substrate (1); peripheral circuit sections (30) and (40) placed on the substrate (1) and connected with the semiconductor element (2); an electrode (30*e*) provided in the peripheral circuit section (30) and grounded; an electrode (30*s*) for grounding connected to a metal layer (30*m*), a metal layer (30*m*) and a source electrode (2*s*) of the semiconductor element (2); and an electrode (30*d*) connected to a gate electrode (2*g*) of the semiconductor element (2).

8 Claims, 11 Drawing Sheets

FOREIGN PATENT DOCUMENTS

| | | |
|---|---|---|
| JP | 62 2466 | 1/1987 |
| JP | 62 108577 | 5/1987 |
| JP | 4-196489 | 7/1992 |
| JP | 8-321567 | 12/1996 |
| JP | 10 294401 | 11/1998 |
| JP | 10-294401 A | 11/1998 |
| JP | 2001-284992 | 10/2001 |
| JP | 2002-134636 A | 5/2002 |
| JP | 2002 527905 | 8/2002 |
| JP | 2002-527905 A | 8/2002 |
| JP | 2003 282721 | 10/2003 |
| JP | 2003-282721 A | 10/2003 |
| JP | 2006 197021 | 7/2006 |
| JP | 2006-197021 A | 7/2006 |
| WO | WO 98/35389 | 8/1998 |
| WO | WO 01/56083 A2 | 8/2001 |
| WO | WO 01/56083 A3 | 8/2001 |

OTHER PUBLICATIONS

Office Action issued Mar. 1, 2011, in Taiwanese Patent Application No. 096137015 (with English-language Translation).

Japanese Office Action issued on Jun. 14, 2011 in corresponding Japanese Application No. 2008-537526 (with an English Translation).

Japanese Office Action issued Feb. 7, 2012, in Patent Application No. 2008-537526 (with English-language translation).

\* cited by examiner

SEMICONDUCTOR DEVICE WITH A PERIPHERAL CIRCUIT FORMED THEREIN

TECHNICAL FIELD

The present invention relates to a semiconductor device which, for example, semiconductor element, such as a Field Effect Transistor (hereinafter, it is described as FET), and passive element, such as capacitor element, are placed on and are connected to a substrate.

BACKGROUND ART

Conventionally, in a semiconductor device which semiconductor element, such as an FET, passive elements, such as a thin film capacitor, etc. are placed on, for example, a printed circuit board or a metal plate and are connected, a structure where a semiconductor element is grounded is used by a via hole (VIA) provided in an inside of the semiconductor element.

In the semiconductor device which has the structure of the thinned GaAs substrate in which a GaAsFET is formed, and grounding any of a desired electrode, such as a gate on a GaAs substrate, a drain, or a source, as a semiconductor device which includes a substrate via hole which passes through the GaAs substrate from the back and reaches a desired electrode, a metal layer which is formed in the back of the GaAs substrate and contacts a desired electrode in a GaAs substrate via hole, a dielectric layer laminated on a metal layer, and a ground electrode layer formed on a dielectric layer, for example, there are some which are described in the Patent Document 1.

Patent Document 1: JP, 62-2466, B.

On the other hand, further high power and high breakdown voltage capability is required with advanced features of an inverter circuit or a switching element. Then, in recent years, as a substrate of an FET element, an SiC (silicon carbide) substrate, which a band gap and a dielectric breakdown electric field are large and has excellent physical properties, is used. This SiC substrate is the substrate material excellent also in thermal conductivity with the thermal conductivity more than metal.

When using the SiC substrate for a power device of a microwave band, it is necessary with a high increase in power to emit the heat to generate efficiently.

However, when it grounds by providing a via hole in the SiC substrate by using the above methods, there is a problem that heat conduction is obstructed in the via hole portion and the thermal conductivity which SiC has cannot be used effectively.

Moreover, in order to form a via hole in the SiC substrate, there is a problem that processes, such as patterning and etching, are required, and the via hole opening process becomes complicated.

In a semiconductor device by which a semiconductor element and peripheral circuit section, such as, a matching circuit section, a bias circuit section, a capacitor element, are placed and connected to on a substrate, an object of the present invention is to provide a semiconductor device which can ground a semiconductor element, and can make heat dissipation characteristics of a semiconductor element satisfactory, without providing a via hole into a semiconductor substrate.

DISCLOSURE OF INVENTION

The semiconductor device according to claim 1 characterized by including: a semiconductor element which is placed on a base substrate; a peripheral circuit section which is placed on the base substrate and connected with the semiconductor element; a metal layer which is provided in the peripheral circuit section and grounded; and an electrode for grounding connected with the metal layer and the semiconductor element.

BEST MODE FOR CARRYING OUT THE INVENTION

Figure 1:
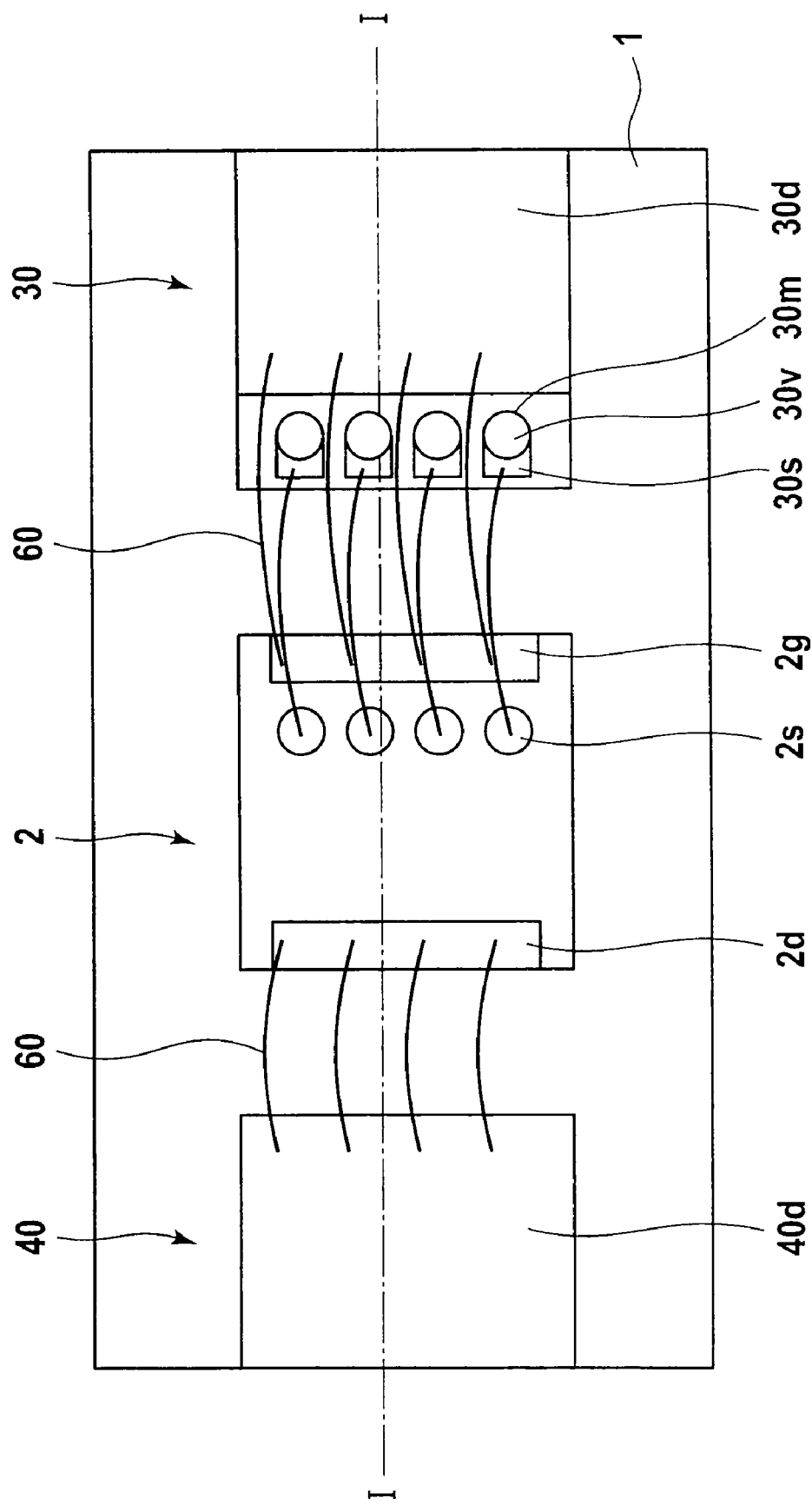
FIG. 1 It is a schematic plan view of a semiconductor device according to a first embodiment of the present invention.

There will be described embodiments of the present invention, with reference to the drawings, where like members or elements are designated by like reference characters to eliminate redundancy, and some layers and their subsidiary regions are designated by the same reference characters for simplicity. Drawings are schematic, not actual, and may be inconsistent in between in scale, ratio, etc.

The embodiments to be described are embodiments of a technical concept or spirit of the present invention that is not limited to embodied specifics, and may be changed without departing from the spirit or scope of claims.

In the following explanation, a semiconductor element is formed on a substrate selected from a SiC substrate, a GaN/SiC substrate, an AlGaN/GaN/SiC substrate, a diamond substrate, and a sapphire substrate.

In particular, for example, when using the AlGaN/GaN/SiC substrate, the semiconductor element is composed as an HEMT (High Electron Mobility Transistor) using the high electron mobility in 2D EG (Two Dimensional Electron Gas) induced by the heterojunction interface. Moreover, for example, when using the GaN/SiC substrate, the semiconductor element can be composed as an MES (Metal semiconductor) FET using a Schottky Gate.

First Embodiment

Figure 2:
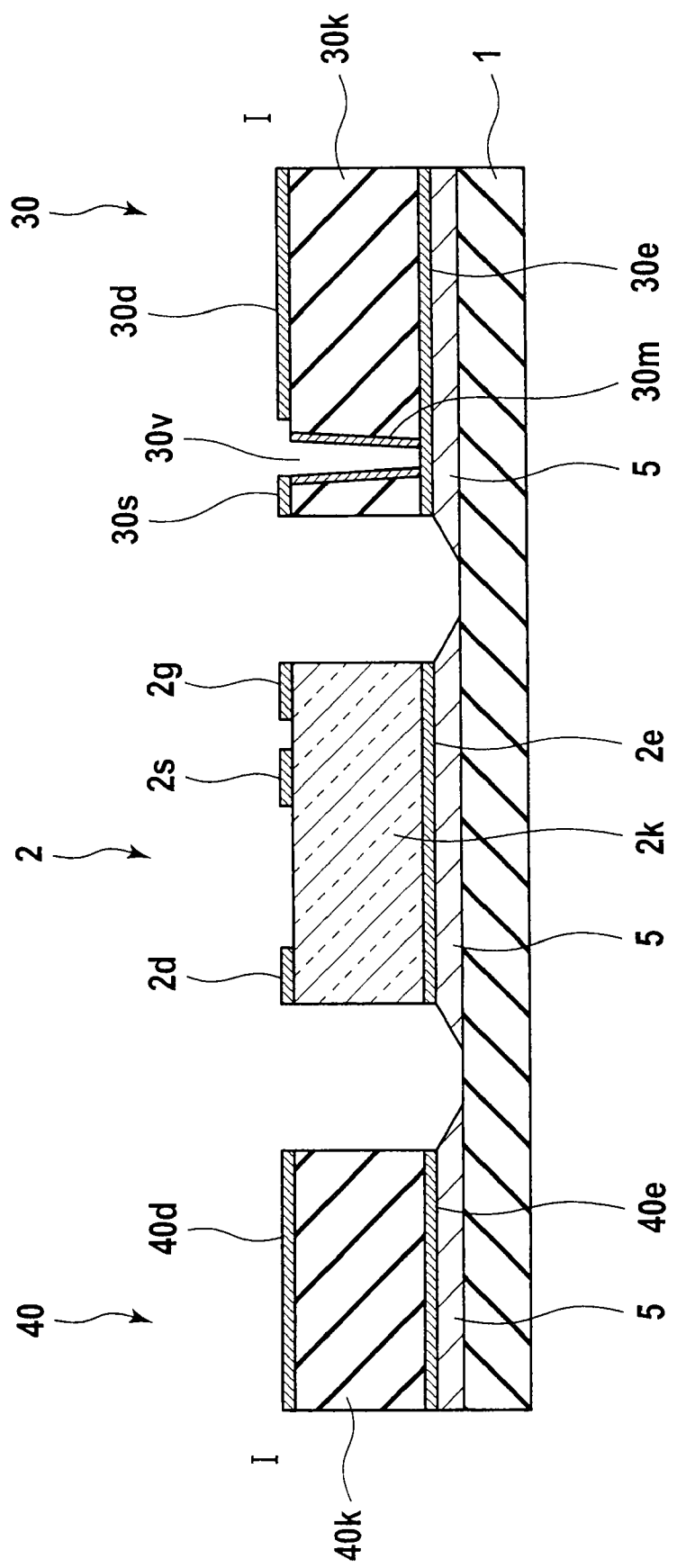
FIG. 2 It shows the semiconductor device according to the first embodiment of the present invention, and is a schematic section structure view taken in the line I-I of FIG. 1.

FIG. 1 shows a schematic plan view of a semiconductor device according to a first embodiment of the present invention, and FIG. 2 shows the semiconductor device according to the first embodiment of the present invention and shows a schematic section structure view taken in the line I-I of FIG. 1.

As shown in FIG. 1 and FIG. 2, the semiconductor device according to the first embodiment of the present invention includes: a semiconductor element 2 which is placed on a base substrate 1; a peripheral circuit sections 30 and 40 which are placed on the base substrate 1 and are connected with the semiconductor element 2; an electrode 30e which is provided in the peripheral circuit section 30 and are grounded; a metal layer 30m; an electrode 30s for grounding connected to 30m and a source electrode 2s of the semiconductor element 2; and an electrode 30d connected to a gate electrode 2g of the semiconductor element 2.

As the peripheral circuit sections 30 and 40, for example, a driver circuit which includes an active element, such as FET, a matching circuit which composes an LC circuit etc., a matching circuit which composes transmission circuitry, such as a strip line, a bias circuit which composes an LC circuit etc., a filter circuit which composes an LC circuit etc., an inductor circuit element, and a capacitor circuit element, etc. can be assumed. In FIG. 1 and FIG. 2, such peripheral circuit sections 30 and 40 are illustrated schematically, and a detailed configuration can be displayed according to the concrete configuration of each circuit.

The semiconductor element 2 may be a field effect transistor formed on the substrate 2s selected from a SiC substrate, a GaN/SiC substrate, an AlGaN/GaN/SiC substrate, a diamond substrate, and a sapphire substrate.

Moreover, the metal layer 30m is formed in a via hole 30v which passes through a substrate 30k which composes the peripheral circuit section 30.

Moreover, a configuration to which two or more electrodes 30s for grounding are connected may be provided for the one via hole 30v.

As shown in FIG. 1 and FIG. 2, for example, the semiconductor element 2, such as FET formed on a SiC substrate, and the peripheral circuit sections 30 and 40 are placed on the substrates 1, such as a printed circuit board or a metal plate in which prescribed wiring patterns are formed, respectively, and are connected with the electrodes 2e, 30e, and 40e by solder 5, respectively. The peripheral circuit sections 30 and 40, for example, have structure which sandwiches the high dielectric substrates 30k and 40k, such as alumina, with the electrode 30e and the electrode 30d, and the electrode 30s for grounding, the electrode 40e, and the electrode 40d, respectively.

In the peripheral circuit section 30, the via hole 30v is formed so that the high dielectric substrate 30k may be passed through. The metal layer 30m is formed in an internal wall of the via hole 30v, and is connected with the electrode 30s for grounding formed in the upper surface of the peripheral circuit section 30.

And, the gate electrode 2g of the semiconductor element 2 is connected with the electrode 30d of the peripheral circuit section 30, the source electrode 2s is connected with the electrode 30s for grounding, and the drain electrode 2d is connected with the electrode 40d of the peripheral circuit section 40, by the wires 60, respectively.

(Fabrication Method)

Such the semiconductor device is formed as follows.

(a) The inside of the via hole 30v of the high dielectric substrates 30k, such as alumina, in which the via hole is beforehand formed at the time of fabrication or the via hole is formed after fabrication by using laser etc., is performed metallizing, for example by Au electroless plating etc., and the metal layer 30m is formed. And then, the electrode 30s for grounding electrically connected to the electrodes 30s and 30d and the via hole 30v is formed on the upper surface of the high dielectric substrate 30k by, for example, vacuum evaporation of Au/Pd(Ni)/Ti, the electrode 30e is formed on the under surface, and thereby forming the peripheral circuit section 30.

(b) Similarly, the metal layer 40e and the electrode 40d is formed on the upper and lower sides of the high dielectric substrate 40k by vacuum evaporation, and thereby forming the peripheral circuit section 40.

(c) And then, the peripheral circuit sections 30 and 40 formed by doing in this way place on and connect to the printed circuit board 1 in which prescribed wiring patterns are formed beforehand, with the semiconductor element 2, such as FET, which an element region is formed and is divided into a chip.

(d) Furthermore, the gate electrode 2g of the semiconductor element 2 is connected with the electrode 30d of the peripheral circuit section 30, the source electrode 2s is connected with electrode 30s for grounding, and the drain electrode 2d is connected with the electrode 40d of the peripheral circuit section 40 and the wires, respectively.

Thus, it becomes possible to ground by forming and grounding a via hole not to the semiconductor element 2 but to the peripheral circuit section 30, without heat conduction being obstructed by via hole even when the SiC substrate is used for the semiconductor element 2.

According to the first embodiment of a present invention, it becomes possible to ground the semiconductor element, and the semiconductor device excellent in the heat radiation characteristics of the semiconductor element can be provided, without providing the via hole into the semiconductor substrate, in the semiconductor device to which the semiconductor element and the peripheral circuit section are placed on and connected to the substrate.

Second Embodiment

Figure 3:
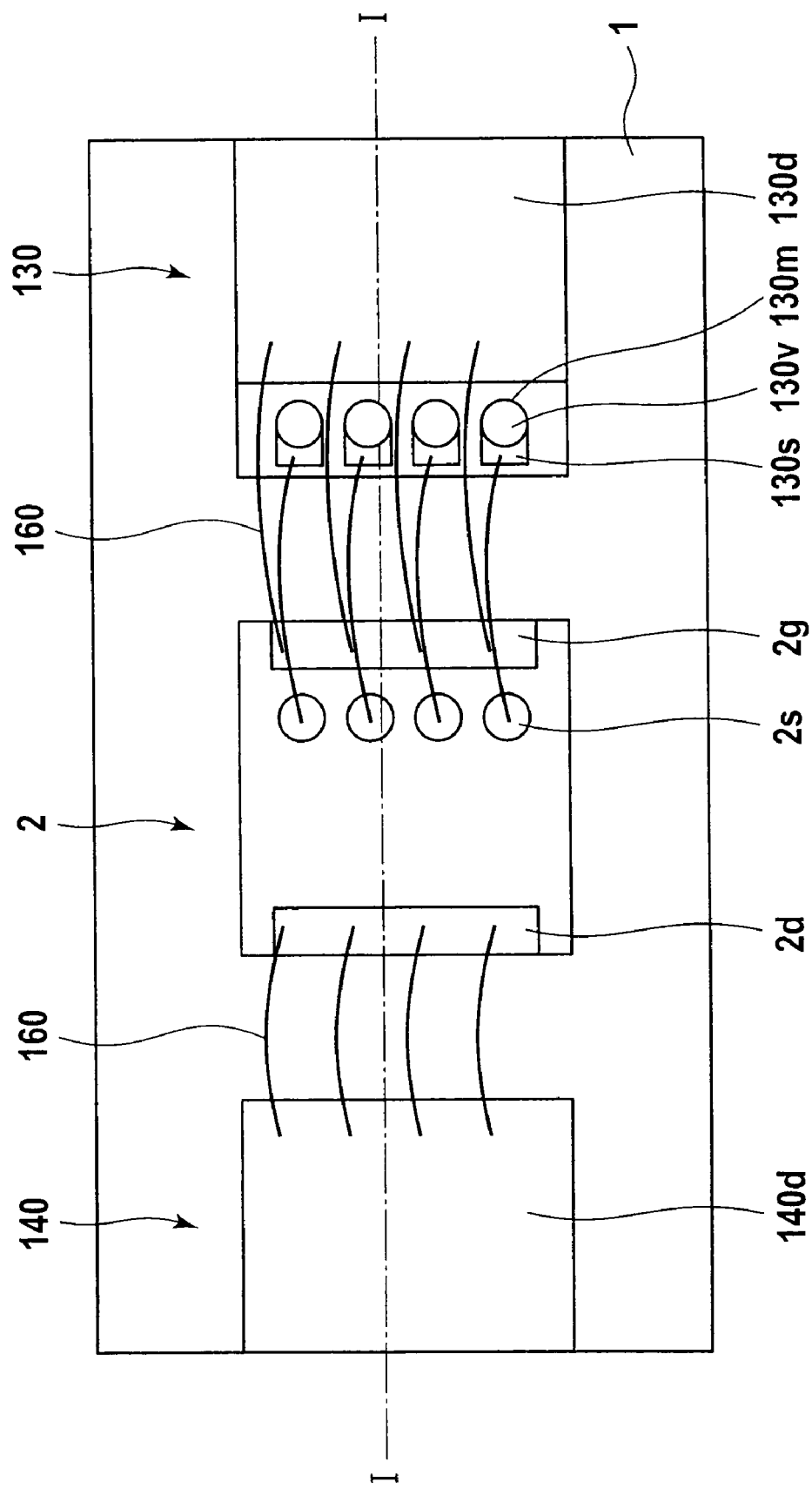
FIG. 3 It is a schematic plan view of a semiconductor device according to a second embodiment of the present invention.
Figure 4:
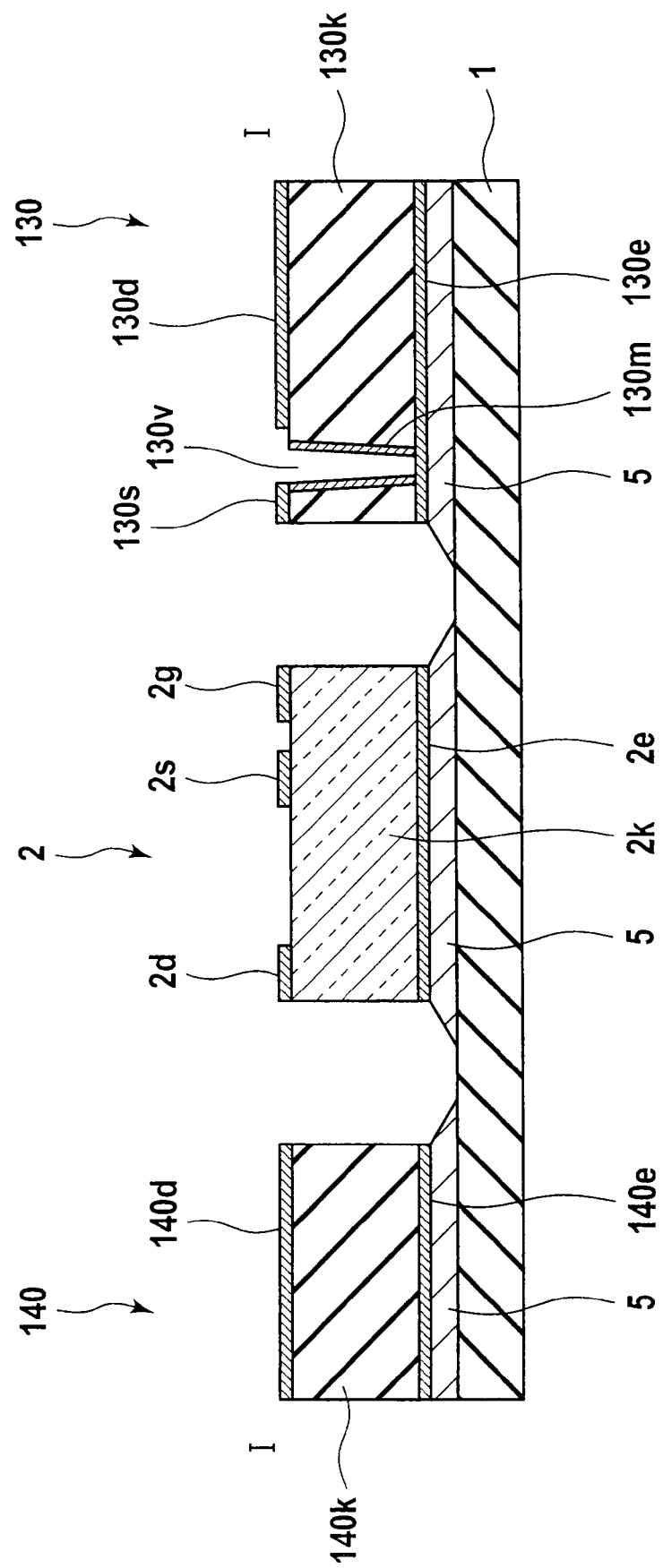
FIG. 4 It shows the semiconductor device according to the second embodiment of the present invention, and is a schematic section structure view taken in the line I-I of FIG. 3.

FIG. 3 shows a schematic plan view of a semiconductor device according to a second embodiment of the present invention, and FIG. 4 shows the semiconductor device according to the second embodiment of the present invention, and shows a schematic section structure taken in the line I-I of FIG. 3.

The semiconductor device according to the second embodiment of the present invention differs in that the a matching circuit section 130 and 140, an electrode 130e, an electrode 140e, a metal layer 130m, an electrode 130s for grounding, a via hole 130v, a wire 160 is provided instead of the peripheral circuit section 30 and 40, the electrode 30e, the electrode 40e, the metal layer 30m, electrode 30s for grounding, the via hole 30v and the wire 60 of the semiconductor device according to the first embodiment.

As shown in FIG. 3 and FIG. 4, the semiconductor device according to the second embodiment of the present invention includes: a semiconductor element 2 placed on a substrate 1; matching circuit sections 130 and 140 which are placed on the substrate 1 and are connected with the semiconductor element 2; an electrode 130e and a metal layer 130m which are provided in the matching circuit section 130 and are grounded; an electrode 130s for grounding connected with the electrode 130e, the metal layer 130m and the semiconductor element 2; and an electrode 130d connected to a gate electrode 2g of the semiconductor element 2.

As the matching circuit sections 130 and 140, for example, a matching circuit which includes active element, such as FET, a matching circuit which compose an LC circuit, etc., a matching circuit which composes a transmission circuitry, such as a strip line, a filter circuit which composes an LC circuit etc., and the like can be assumed. In FIG. 3 and FIG. 4, such the matching circuit sections 130 and 140 are illustrated schematically, and a detailed configuration can be represented according to a concrete configuration of each circuit.

The semiconductor element 2 may be a field effect transistor formed on the substrate 2s selected from a SiC substrate, a GaN/SiC substrate, an AlGaN/GaN/SiC substrate, a diamond substrate, and a sapphire substrate.

Moreover, the metal layer 130m is formed in the via hole 130v which passes through the matching circuit section 130.

Moreover, a configuration to which two or more electrode 130s for grounding is connected may be provided for the one via hole 130v.

As shown in FIG. 3 and FIG. 4, for example, the semiconductor element 2, such as FET formed on a SiC substrate, and the matching circuit sections 130 and 140 are placed on the substrates 1, such as a printed circuit board or a metal plate in which prescribed wiring patterns are formed, respectively, and are connected with the electrodes 2e, 130e and 140e by the solder 5, respectively. The matching circuit sections 130 and 140 have structure which sandwiches, for example, the high dielectric substrates 130k and 140k, such as alumina, with the electrode 130e and the electrode 130s for grounding, and the electrode 130d, the electrode 140e and the electrode 140d, respectively.

In the matching circuit section 130, the via hole 130v is formed so that the high dielectric substrate 130s may be passed through. The metal layer 130m is formed in an internal wall of the via hole 130v, and is connected with electrode 130s for grounding formed in the upper surface of the matching circuit section 130.

And, the gate electrode 2g of the semiconductor element 2 is connected with the electrode 130d of the matching circuit section 130, the source electrode 2s is connected with the electrode 130s for grounding, and the drain electrode 2d is connected with the electrode 140d of the matching circuit section 140, by the wires 160, respectively.

(Fabrication Method)

Such the semiconductor device is formed as follows.

(a) The inside of the via hole 130v of the high dielectric substrates 130k, such as alumina in which the via hole is beforehand formed at the time of fabrication or the via hole is formed after fabrication using laser etc. is performed metallizing, for example by Au electroless plating etc., and thereby forming the metal layer 130m. And then, the electrode 130s for grounding corresponding to the electrodes 130e and 130d and the via hole 130v is formed on the upper and lower sides of the high dielectric substrate 130k, for example by vacuum evaporation of Au/Pd(Ni)/Ti, and thereby forming the matching circuit section 130.

(b) Similarly, the electrodes 140e and 140d is formed on the upper and lower sides of the high dielectric substrate 140k by vacuum evaporation, and thereby forming the matching circuit section 140.

(c) And then, the matching circuit sections 130 and 140 formed by doing in this way is placed on and connected to the printed circuit board 1 in which prescribed wiring patterns are formed beforehand, with the semiconductor elements 2, such as FET, which the element region is formed and is divided into a chip.

(d) Furthermore, the gate electrode 2g of the semiconductor element 2 is connected with the electrode 130d of the matching circuit section 130, the source electrode 2s is connected with the electrode 130s for grounding, and the drain electrode 2d is connected with the electrode 140d of the matching circuit section 140.

Thus, it becomes possible to ground, without heat conduction being obstructed by via hole even when the SiC substrate is used for the semiconductor element 2 by forming and grounding the via hole not to the semiconductor element 2 but to the matching circuit section 130.

According to the second embodiment of the present invention, it becomes possible to ground the semiconductor element, and the semiconductor device excellent in the heat dissipation characteristics of the semiconductor element can be provided, without providing a via hole into a semiconductor substrate, in the semiconductor device to which the semiconductor element and the matching circuit section are placed on and connected to the substrate.

Third Embodiment

Figure 5:
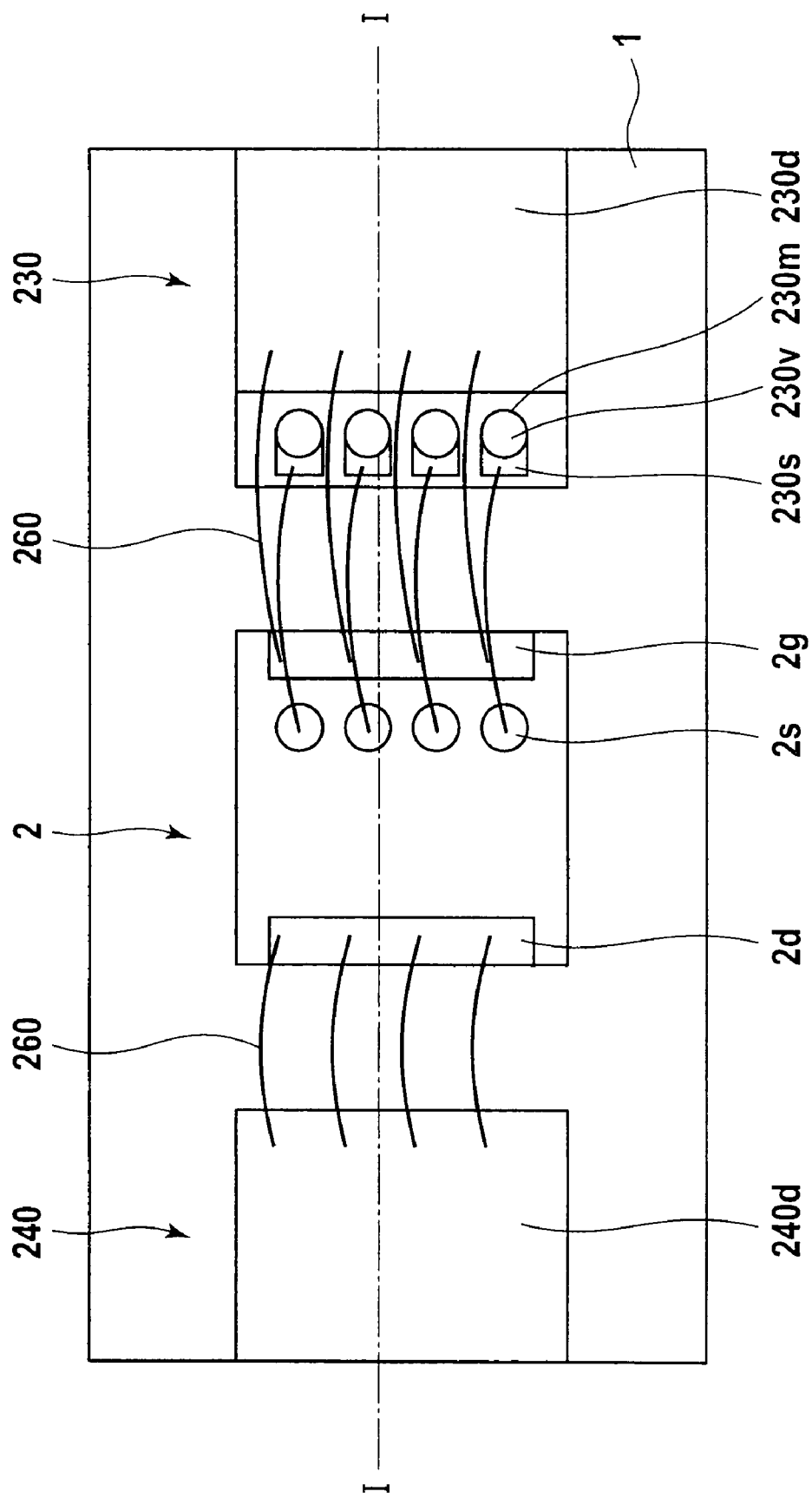
FIG. 5 It is a schematic plan view of a semiconductor device according to a third embodiment of the present invention.
Figure 6:
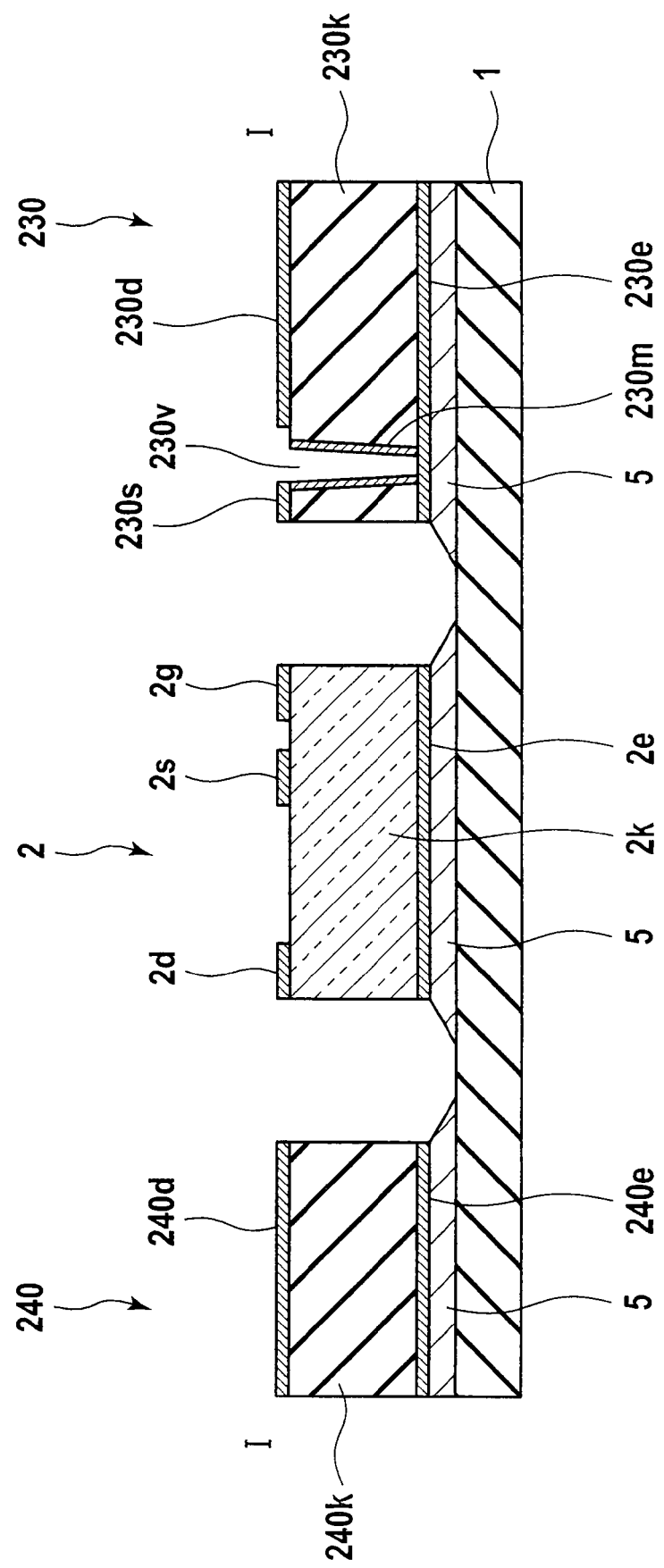
FIG. 6 It shows the semiconductor device according to the third embodiment of the present invention, and is a schematic section structure view taken in the line I-I of FIG. 5.

FIG. 5 shows a schematic plan view of a semiconductor device according to a third embodiment of the present invention, and FIG. 6 shows the semiconductor device according to the third embodiment of the present invention, and shows a schematic section structure taken in the line I-I of FIG. 5.

As shown in FIG. 5 and FIG. 6, the semiconductor device according to the third embodiment of the present invention includes: a semiconductor element 2 placed on a substrate 1; bias circuit sections 230 and 240 which are placed on the substrate 1 and connected with the semiconductor element 2; an electrode 230e and a metal layer 230m which are provided in the bias circuit section 230 and are grounded; an electrode 230s for grounding connected with the electrode 230e, the metal layer 230m and the semiconductor element 2; and an electrode 230d connected to 2g of the semiconductor element 2.

As the bias circuit sections 230 and 240, for example, a bias circuit which include an active element, such as FET, a bias circuit which composes an LC circuit etc., a bias circuit which composes transmission circuitry, such as a strip line, a bias circuit which composes an LC circuit etc., and a bias circuit which composes an inductor circuit element, etc. can be assumed. In FIG. 5 and FIG. 6, such the bias circuit sections 230 and 240 are illustrated schematically, and a detailed configuration can be represented according to a concrete configuration of each circuit.

The semiconductor element 2 may be a field effect transistor formed on the substrate 2s selected from a SiC substrate, a GaN/SiC substrate, an AlGaN/GaN/SiC substrate, a diamond substrate, and a sapphire substrate.

Moreover, the metal layer 230m is formed in a via hole 230v which passes through the bias circuit section 230.

Moreover, a configuration to which two or more electrodes 230s for grounding are connected may be provided for the one via hole 230v.

Moreover, in the semiconductor device according to the third embodiment of the present invention, the matching circuit sections 130 and 140 placed as well as the second embodiment on the identical substrate 1 may be further provided.

The semiconductor device according to the third embodiment of the present invention may include: a semiconductor element placed on the substrate; a matching circuit section and a bias circuit section which are placed on the substrate and connected with the semiconductor element; a metal layer which is provided in either or both of the matching circuit section and the bias circuit section and is grounded; and an electrode for grounding connected with the metal layer and the semiconductor element.

Moreover, a metal layer may be provided with a configuration formed in the via hole which passes through either or both of the matching circuit section and the bias circuit section.

Moreover, a configuration to which two or more electrodes for grounding are connected to one via hole may be provided.

As shown in FIG. 5 and FIG. 6, for example, the semiconductor elements 2, such as FET formed on a SiC substrate, and the bias circuit sections 230 and 240 are placed on the substrates 1, such as a printed circuit board or a metal plate in which prescribed wiring patterns are formed, respectively, and are connected with the electrodes 2e, 230e, and 240e by the solder 5, respectively. The bias circuit sections 230 and 240 have structure which sandwiches, for example, the high dielectric substrates 230k and 240k, such as alumina, with the electrodes 230e and 230d and the electrodes 240e and 240d, respectively.

In the bias circuit section 230, the via hole 230v is formed so that the high dielectric substrate 230k may be passed through. The metal layer 230m is formed in an internal wall of the via hole 230v, and is connected with the electrode 230s for grounding formed in the upper surface of the bias circuit section 230.

And, the gate electrode 2g of the semiconductor element 2 is connected with the electrode 230d of the bias circuit section 230, a source electrode 2s is connected with the electrode 230s for grounding, and the drain electrode 2d is connected with the electrode 240d of the bias circuit section 240, by the wires 260, respectively.

(Fabrication Method)

Such the semiconductor device is formed as follows.

(a) The inside of the via hole 230v of the high dielectric substrates 230k, such as alumina in which the via hole is beforehand formed at the time of fabrication or the via hole is formed after fabrication using laser etc. is performed metallizing, for example by Au electroless plating etc., and thereby forming the metal layer 230m. And then, the electrode 230s for grounding corresponding to the electrodes 230e and 230d and the via hole 230v is formed on the upper and lower sides of the high dielectric substrate 230k, for example by vacuum evaporation of Au/Pd(Ni)/Ti, and thereby forming the bias circuit section 230.

(b) Similarly, the electrodes 240e and 240d is formed on the upper and lower sides of the high dielectric substrate 240k by vacuum evaporation, and thereby forming the bias circuit section 240.

(c) And then, the bias circuit sections 230 and 240 formed by doing in this way is placed on and connected to the printed circuit board 1 in which prescribed wiring patterns are formed beforehand, with the semiconductor elements 2, such as FET, which the element region is formed and is divided into a chip.

(d) Furthermore, the gate electrode 2g of the semiconductor element 2 is connected with the electrode 230d of the bias circuit section 230, the source electrode 2s is connected with the electrode 230s for grounding, and the drain electrode 2d is connected with the electrode 240d of the bias circuit section 240.

Thus, it becomes possible to ground, without heat conduction being obstructed by via hole even when the SiC substrate is used for the semiconductor element 2 by forming and grounding the via hole not to the semiconductor element 2 but to the bias circuit section 230 and 240.

According to the third embodiment of the present invention, it becomes possible to ground the semiconductor element, and the semiconductor device excellent in the heat dissipation characteristics of the semiconductor element can be provided, without providing a via hole into a semiconductor substrate, in the semiconductor device to which the semiconductor element and the bias circuit section are placed on and connected to the substrate.

Fourth Embodiment

Figure 7:
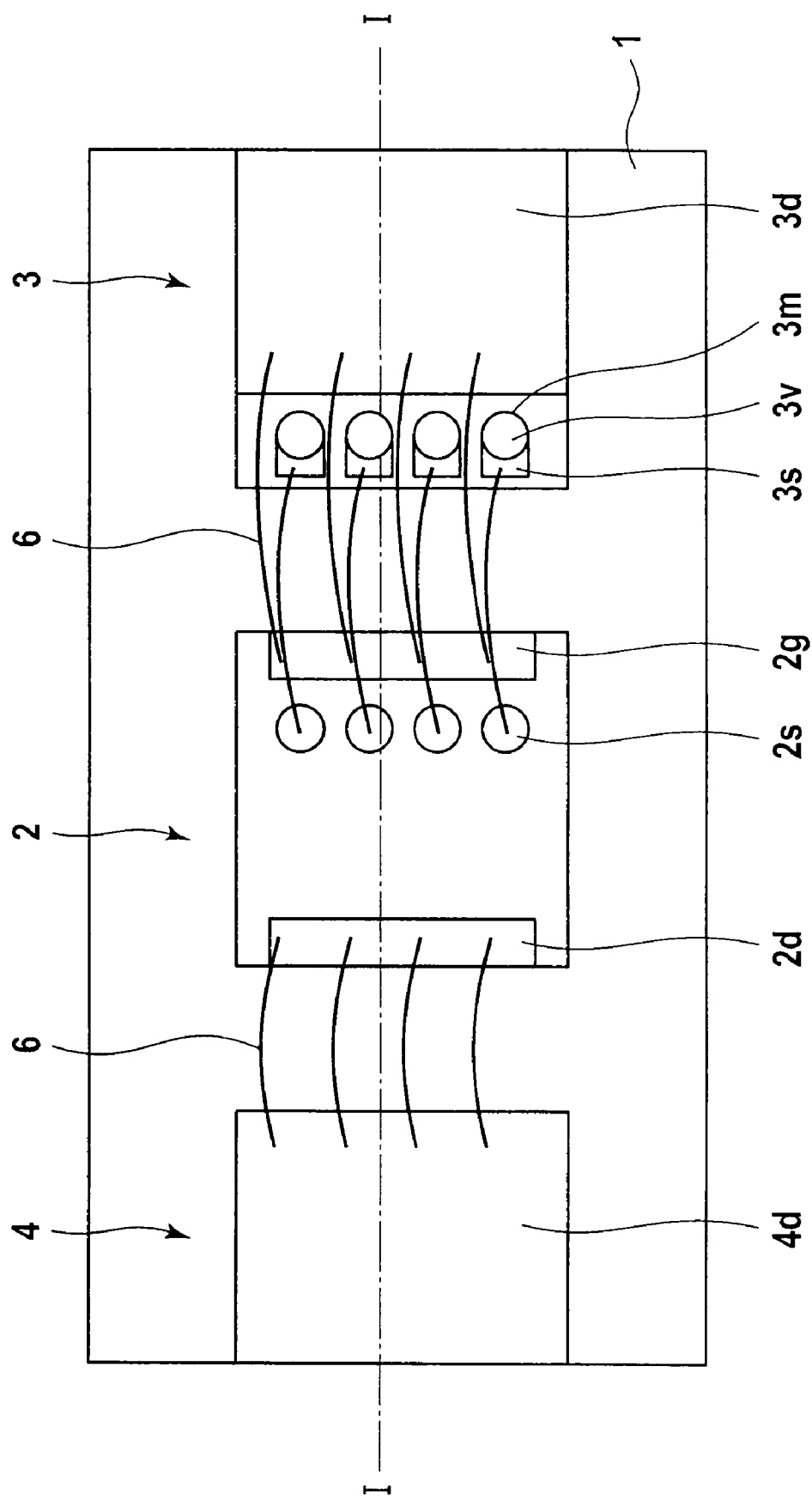
FIG. 7 It is a schematic plan view of a semiconductor device according to a fourth embodiment of the present invention.
Figure 8:
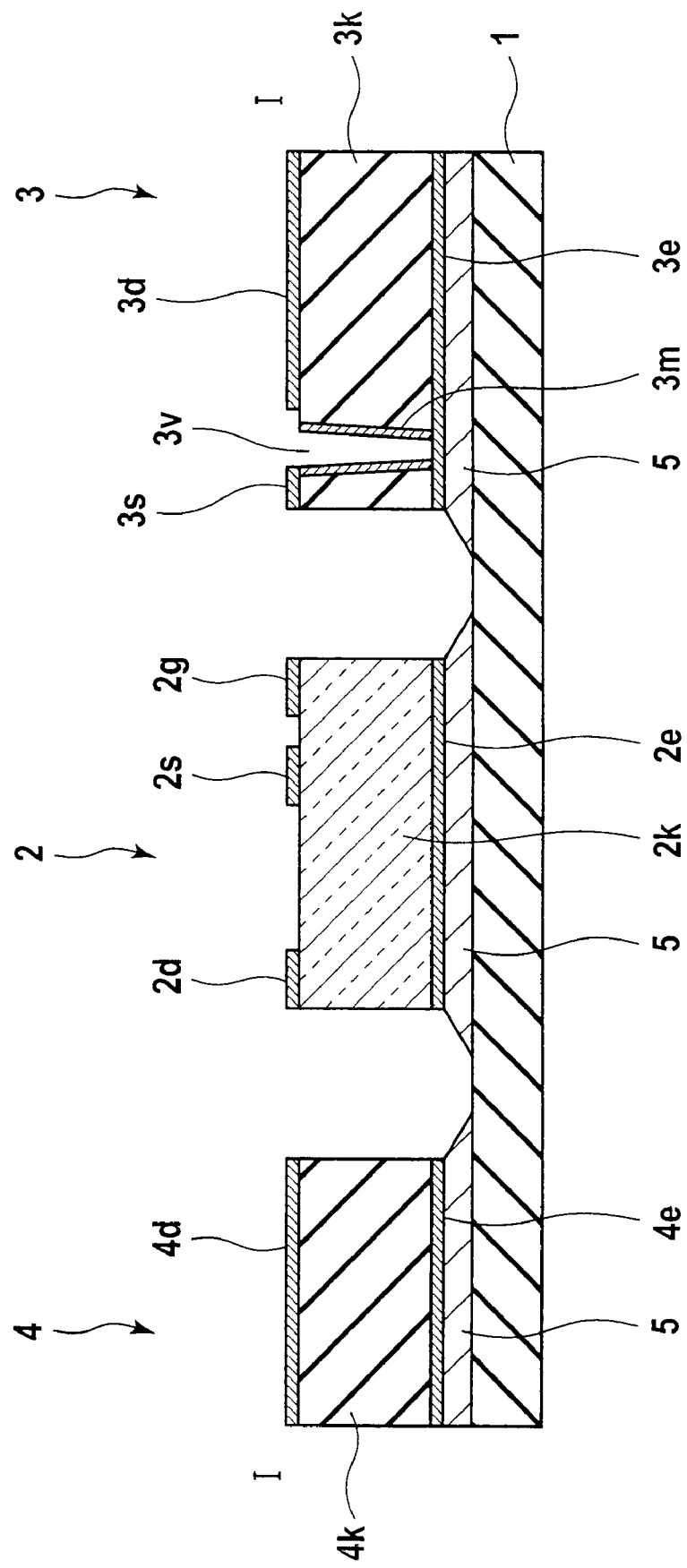
FIG. 8 It shows the semiconductor device according to the fourth embodiment of the present invention, and is a schematic section structure view taken in the line I-I of FIG. 7.

FIG. 7 shows a schematic plan view of a semiconductor device according to a fourth embodiment of the present invention, and FIG. 8 shows the semiconductor device according to the fourth embodiment of the present invention, and shows a schematic section structure taken in the line I-I of FIG. 7.

As shown in FIG. 7 and FIG. 8, the semiconductor device according to the fourth embodiment of the present invention includes: a semiconductor element 2 placed on a substrate 1; capacitor elements 3 and 4 which are placed on the substrate 1 and connected with the semiconductor element 2; an electrode 3e and a metal layer 3m which are provided in the capacitor circuit section 3 and are grounded; an electrode 3s for grounding connected with the electrode 3e, the metal layer 3m and the semiconductor element 2; and an electrode 3d connected to a gate electrode 2g of the semiconductor element 2.

The semiconductor element 2 may be a field effect transistor formed on the substrate 2s selected from a SiC substrate, a GaN/SiC substrate, an AlGaN/GaN/SiC substrate, a diamond substrate, and a sapphire substrate.

Moreover, the metal layer 3m is formed in a via hole 3v which passes through the capacitor circuit section 3.

Moreover, so as to mention later, two or more electrodes for grounding may be connected with the one via hole 3v.

As shown in FIG. 7 and FIG. 8, for example, the semiconductor elements 2, such as FET formed on a SiC substrate, and the thin film capacitors 3 and 4 are placed on the substrates 1, such as a printed circuit board or a metal plate in which prescribed wiring patterns are formed, respectively, and are connected with the electrodes 2e, 3e, and 4e by the solder 5, respectively. The thin film capacitors 3 and 4 have structure which sandwiches the high dielectric substrates 3k and 4k, such as alumina, with the electrodes 3e, 3d, 4e and 40, respectively. In the thin film capacitor 3, the via hole 3v is formed so that the high dielectric substrate 3k may be passed through. The metal layer 3m is formed in an internal wall of the via hole 3v, and is connected with the electrode 3s for grounding formed in the upper surface of the thin film capacitor 3. And, the gate electrode 2g of the semiconductor element 2 is connected with the electrode 3d of the thin film capacitor 3, a source electrode 2s is connected with the electrode 3s for grounding, and the drain electrode 2d is connected with the electrode 4d of the thin film capacitor 4, by the wires 6, respectively.

(Fabrication Method)

Such the semiconductor device is formed as follows.

(a) The inside of the via hole 3v of the high dielectric substrates 3k, such as alumina in which the via hole is beforehand formed at the time of fabrication or the via hole is formed after fabrication using laser etc. is performed metallizing, for example by Au electroless plating etc., and thereby forming the metal layer 3m. And then, the electrode 3s for grounding corresponding to the electrodes 3e and 3d and the via hole 3v is formed on the upper and lower sides of the high dielectric substrate 3k, for example by vacuum evaporation of Au/Pd (Ni)/Ti, and thereby forming the thin film capacitor 3.

(b) Similarly, the electrodes 4e and 4d is formed on the upper and lower sides of the high dielectric substrate 4k by vacuum evaporation, and thereby forming the thin film capacitor 4.

(c) And then, the thin film capacitors 3 and 4 formed by doing in this way are placed on and connected to the printed circuit board 1 in which prescribed wiring patterns are formed beforehand, with the semiconductor elements 2, such as FET which the element region is formed and is divided into a chip.

(d) Furthermore, the gate electrode 2g of the semiconductor element 2 is connected with the electrode 3d of the thin film capacitor 3, the source electrode 2s is connected with the electrode 3s for grounding, and the drain electrode 2d is connected with the electrode 4d of the thin film capacitor 4.

Thus, it becomes possible to ground, without heat conduction being obstructed by via hole even when the SiC substrate is used for the semiconductor element 2 by forming and grounding the via hole not to the semiconductor element 2 but to the thin film capacitor 3.

Figure 9:
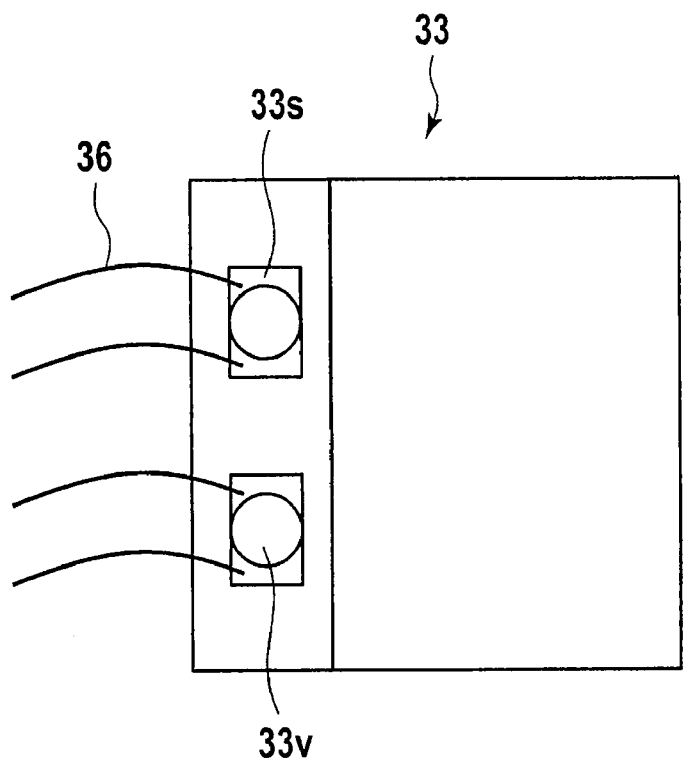
FIG. 9 It is a schematic plan view showing an electrode of a thin film capacitor of the semiconductor device according to a fourth embodiment of the present invention.
Figure 10:
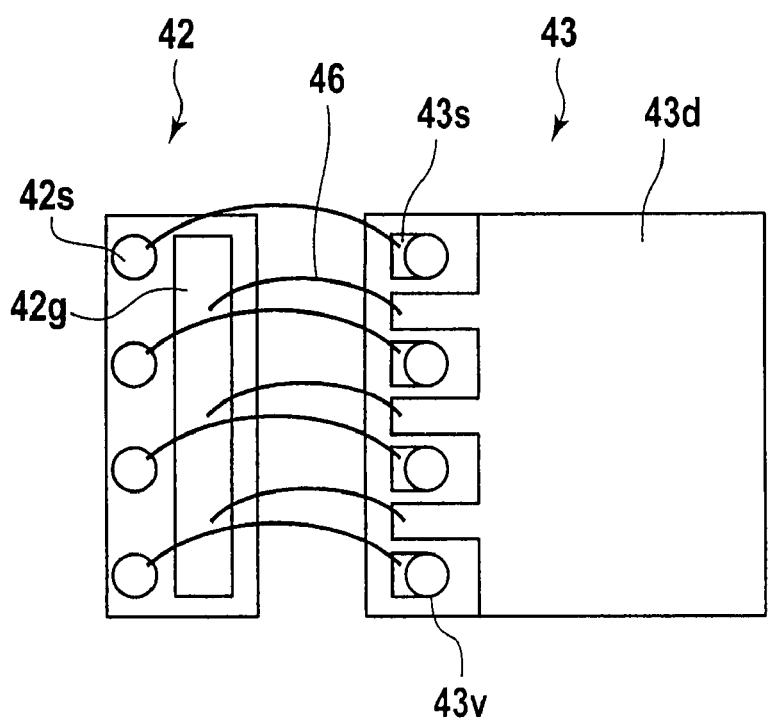
FIG. 10 It is a schematic plan view showing the electrode of the thin film capacitor of the semiconductor device according to a fourth embodiment of the present invention.

FIG. 9 shows a schematic plan view showing the electrode of the thin film capacitor of the semiconductor device according to the fourth embodiment of the present invention. Moreover, FIG. 10 shows a schematic plan view showing the electrode of the thin film capacitor of the semiconductor device according to the fourth embodiment of the present invention.

In the fourth embodiment of the present invention, although the electrode 3s for grounding is formed so that it might correspond to the via hole 3v of the thin film capacitor 3, respectively, even if it does not necessarily correspond to one to one, two or more electrodes 33s for grounding may be formed for the one via hole 33v of the thin film capacitor 33, and may connect to each electrode 33s for grounding with the wires 36, as shown in FIG. 9. Although formation of the via hole 33v has a certain amount of limitation to an installation interval etc. with processability and intensity, accordingly flexibility of a design can be improved. Moreover, as shown in FIG. 10, it may form so that a part of electrode 43d may be placed between the via holes 43v of the thin film capacitor 43. Accordingly, the wire 46 which connects the gate electrode 42g of the semiconductor element 42 and the electrode 43d for grounding of the thin film capacitor 43 can be shortened, and it becomes possible to reduce parasitic resistance and a parasitic inductor.

According to the fourth embodiment of the present invention, it becomes possible to ground the semiconductor element, and the semiconductor device excellent in the heat dissipation characteristics of the semiconductor element can be provided, without providing a via hole into a semiconductor substrate, in the semiconductor device to which the semiconductor element and the capacitor element are placed on and connected to the substrate.

Fifth Embodiment

Figure 11:
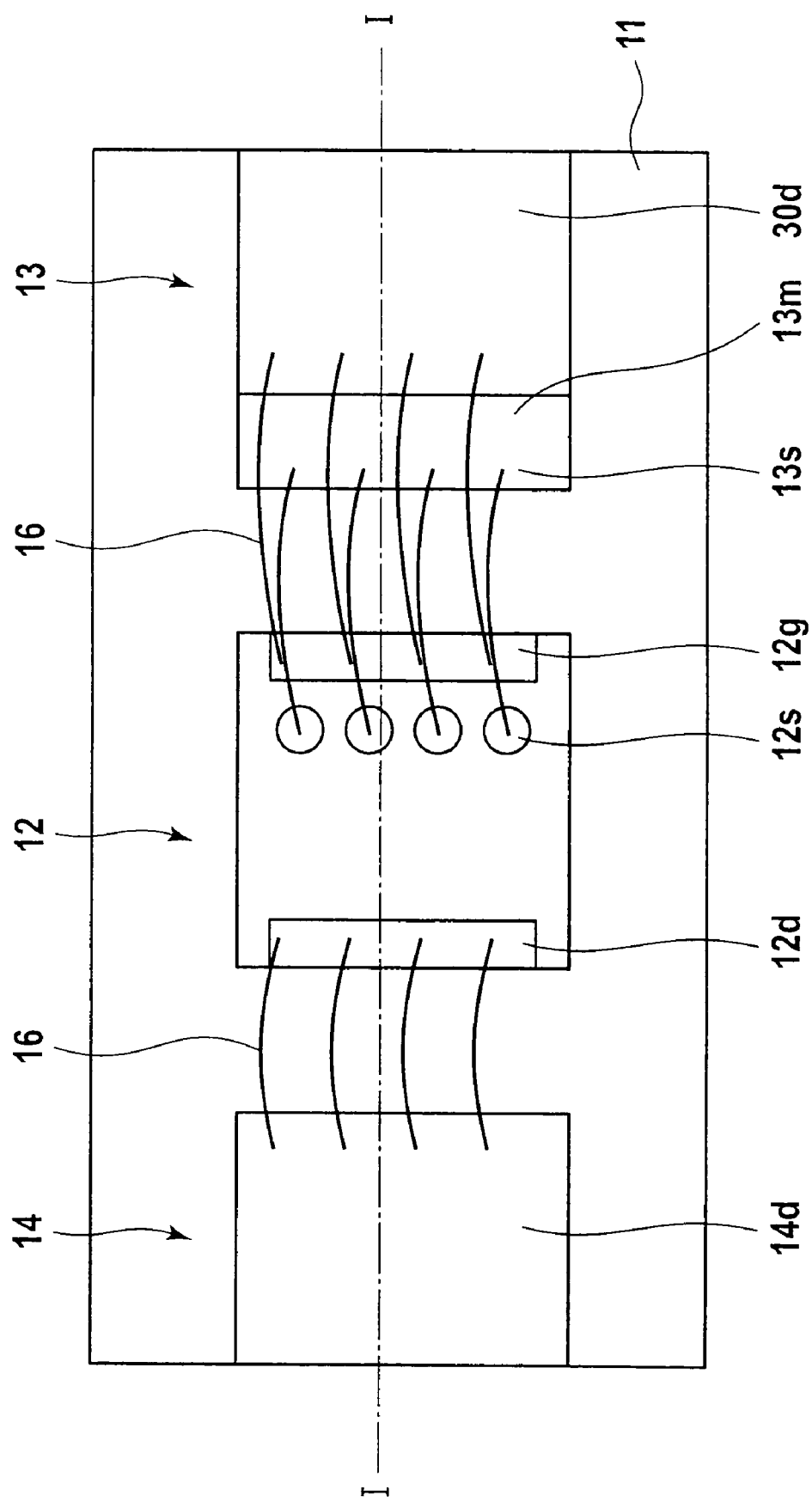
FIG. 11 It is a schematic plan view of a semiconductor device according to a fifth embodiment of the present invention.
Figure 12:
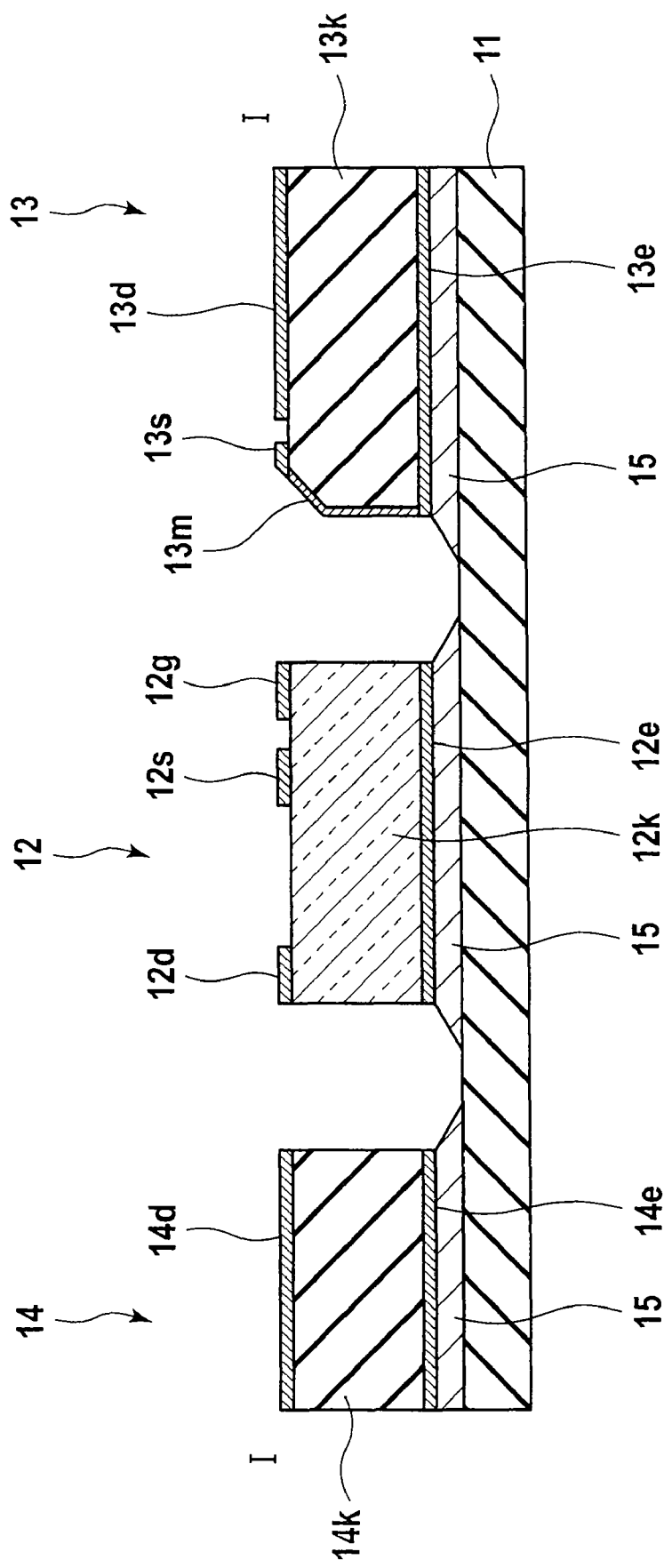
FIG. 12 It shows the semiconductor device according to the fifth embodiment of the present invention, and is a schematic section structure view taken in the line I-I of FIG. 11.

FIG. 11 shows a schematic plan view of a semiconductor device according to a fifth embodiment of the present invention, and FIG. 12 shows the semiconductor device according to the fifth embodiment of the present invention, and shows a schematic section structure taken in the line I-I of FIG. 11.

As shown in FIG. 11 and FIG. 12, the semiconductor device according to the fifth embodiment of the present invention includes: a semiconductor element 12 placed on a substrate 11; capacitor elements 13 and 14 which are placed on the substrate 11 and connected with the semiconductor element 12; an electrode 13e and a metal layer 13m which are provided in the capacitor circuit section 13 and are grounded; an electrode 13s for grounding connected with the electrode 13e, the metal layer 13m and the semiconductor element 12; and an electrode 30d connected to a gate electrode 12g of the semiconductor element 12.

Moreover, the semiconductor element 12 may be a field effect transistor formed on the substrate 12k selected from a SiC substrate, a GaN/SiC substrate, an AlGaN/GaN/SiC substrate, a diamond substrate, and a sapphire substrate.

Moreover, the metal layer 13m is formed in a sidewall of the capacitor element 13.

As shown in FIG. 11 and FIG. 12, for example, the semiconductor elements 12, such as FET formed on a SiC substrate, and the thin film capacitors 13 and 14 are placed on the substrates 1, such as a printed circuit board or a metal plate in which prescribed wiring patterns are formed, respectively, and are connected by the solder 15. The thin film capacitors 13 and 14 have structure which sandwiches the high dielectric substrates 13k and 14k, such as alumina, with the electrodes 13e, 13d, 14e and 14d. In the thin film capacitor 13, a taper is formed in an edge part of the high dielectric substrate 13, and a metal layer 13m is formed in the taper from the side of the high dielectric substrate 13k and is connected with the electrode 13s for grounding formed in the upper surface of the thin film capacitor 13. And, the gate electrode 12g of the semiconductor element 12 is connected with the electrode 13d of the thin film capacitor 13, a source electrode 12s is connected with the electrode 13s for grounding, and the drain electrode 12d is connected with the electrode 14d of the thin film capacitor 14, by the wires 16, respectively.

(Fabrication Method)

Such the semiconductor device is formed as follows.

(a) The electrodes 13e and 13d and electrode 13s for grounding are formed on upper and lower sides and the side face of the high dielectric substrates 13k, such as alumina in which a taper is formed beforehand at the time of fabrication, or formed after fabrication, and a taper, for example by vacuum evaporation of Au/Pd(Ni)/Ti. At this time, the satisfactory metal layer 13m is formed also in the taper section by vacuum evaporation two-way of the direction of the upper surface, and the direction of side face. Thus, the thin film capacitor 13 is formed.

(b) Similarly, the electrodes 14e and 14d is formed on the upper and lower sides of the high dielectric substrate 14k by vacuum evaporation, and thereby forming the thin film capacitor 14.

(c) And then, the thin film capacitors 13 and 14 formed by doing in this way are placed on and connected to the printed circuit board 11 in which prescribed wiring patterns are formed beforehand, with the semiconductor elements 12, such as FET which the element region is formed and is divided into a chip.

(d) Furthermore, the gate electrode 12g of the semiconductor element 12 is connected with the electrode 13d of the thin film capacitor 13, the source electrode 13s is connected with the electrode 13s for grounding, and the drain electrode 13d is connected with the electrode 14d of the thin film capacitor 14.

Thus, it becomes possible to ground, without heat conduction being obstructed by via hole even when the SiC substrate is used for the semiconductor element 2 by forming and grounding the via hole not to the semiconductor element 2 but to the thin film capacitor 3, and although formation of the via hole has a certain amount of limitation to an installation interval etc. with processability and intensity, without forming such the via hole.

According to the fifth embodiment of the present invention, it becomes possible to ground the semiconductor element, and the semiconductor device excellent in the heat dissipation characteristics of the semiconductor element can be provided, without providing a via hole into a semiconductor substrate, in the semiconductor device to which the semiconductor element and the bias circuit section are placed on and connected to the substrate.

OTHER EMBODIMENTS

The present invention has been described by the first to fifth embodiments and its modification, as a disclosure including associated description and drawings to be construed as illustrative, not restrictive. With the disclosure, artisan might easily think up alternative embodiments, embodiment examples, or application techniques.

Also in the semiconductor devices according to the first to the fourth embodiment, the same configuration as the fifth embodiment is adoptable. That is, by providing sidewall contact instead of the via hole contact, in the semiconductor device by which peripheral circuit sections, such as the semiconductor element, the matching circuit section, the bias circuit section, the capacitor element, are placed on and connected on the substrate, it becomes possible to ground the semiconductor element, and the semiconductor device excellent in the heat radiation characteristics of the semiconductor element can be provided, without providing the via hole into the semiconductor substrate, in the sidewall contact.

Although the SiC substrate is mentioned as the substrate used for the semiconductor elements 2 and 12 in the first to the fifth embodiment, it is not limited to this, and it becomes possible to ground without satisfactory heat conduction being obstructed by via hole formation when using a satisfactory substrate of heat radiation characteristics, such as a GaN/SiC substrate, an AlGaN/GaN/SiC substrate, and a diamond substrate.

In the case of silicon or GaAs substrate, processing for formation of the via hole is easy, but it is also effective to apply, also when using a difficult substrate of processing for formation of via holes, such as a SiC substrate and a sapphire substrate.

Such being the case, the present invention covers a variety of embodiments, whether described or not. Therefore, the technical scope of the present invention is appointed only by the invention specific matter related appropriate scope of claims from the above-mentioned explanation.

According to the embodiments of the present invention, it becomes possible to ground the semiconductor element, and the semiconductor device excellent in the heat dissipation characteristics of the semiconductor element can be provided, without providing a via hole into a semiconductor substrate, in the semiconductor device to which the semiconductor element, the matching circuit section, the bias circuit section and the capacitor element are placed on and connected to the substrate.

The invention claimed is:

1. A semiconductor device comprising:
a substrate;
a semiconductor element having a semiconductor substrate which is placed on the substrate;
a source electrode which is placed on the semiconductor element;
a peripheral circuit section having a high dielectric substrate which is placed on the substrate and the peripheral circuit section being placed adjacent to the semiconductor element;
a via hole which passes through the high dielectric substrate from a surface of the high dielectric substrate to a surface of the substrate;
a first metal layer which is provided in a sidewall of the via hole;
a second metal layer which is placed on a bottom surface of the high dielectric substrate which is facing with the substrate; and
an electrode for grounding which is placed on the surface of the high dielectric substrate, and the electrode for grounding being connected with the second metal layer via the first metal layer and being connected with the source electrode via only a bonding wire, wherein
the source electrode is grounded by the second metal layer place between the peripheral circuit section and the substrate via the via hole formed inside the peripheral circuit section.

2. The semiconductor device according to claim 1, wherein the semiconductor element is a field effect transistor formed on the substrate selected from a SiC substrate, a GaN/SiC substrate, an AlGaN/GaN/SiC substrate, a diamond substrate, and a sapphire substrate.

3. The semiconductor device according to claim 1, comprising two or more electrodes for grounding which are connected with the one via hole.

4. The semiconductor device according to claim 1, wherein the peripheral circuit section is a matching circuit section.

5. The semiconductor device according to claim 1, wherein the peripheral circuit section is a bias circuit section.

6. The semiconductor device according to claim 1, wherein the peripheral circuit sections comprises a matching circuit section and a bias circuit section.

7. The semiconductor device according to claim 6, wherein the first metal layer is formed in a via hole which passes through the matching circuit section and the bias circuit section.

8. The semiconductor device according to claim 1, wherein the peripheral circuit section comprises a capacitor element.

* * * * *